United States Patent
Grillot et al.

(10) Patent No.: US 9,905,730 B2
(45) Date of Patent: Feb. 27, 2018

(54) LIGHT EMITTING DEVICE WITH BONDED INTERFACE

(71) Applicant: Lumileds LLC, San Jose, CA (US)

(72) Inventors: Patrick N. Grillot, San Jose, CA (US); Rafael I. Aldaz, Santa Clara, CA (US); Deborah L. Colbentz, Sunnyvale, CA (US); Anneli Munkholm, Mountain View, CA (US); Hanmin Zhao, Fremont, CA (US)

(73) Assignee: Lumileds LLC, San Jose, CA (US)

( * ) Notice: Subject to any disclaimer, the term of this patent is extended or adjusted under 35 U.S.C. 154(b) by 410 days.

(21) Appl. No.: 14/200,203

(22) Filed: Mar. 7, 2014

(65) Prior Publication Data
US 2014/0183595 A1 Jul. 3, 2014

Related U.S. Application Data

(63) Continuation of application No. 11/957,031, filed on Dec. 14, 2007, now Pat. No. 8,692,286.

(51) Int. Cl.
*H01L 33/30* (2010.01)
*H01L 33/00* (2010.01)
*H01L 33/02* (2010.01)

(52) U.S. Cl.
CPC .......... *H01L 33/30* (2013.01); *H01L 33/0079* (2013.01); *H01L 33/025* (2013.01)

(58) Field of Classification Search
None
See application file for complete search history.

(56) References Cited

U.S. PATENT DOCUMENTS

| | | |
|---|---|---|
| 5,008,718 A | 4/1991 | Fletcher et al. |
| 5,196,375 A | 3/1993 | Hoshi |
| 5,204,284 A | 4/1993 | Kuo et al. |
| 5,233,204 A | 8/1993 | Fletcher et al. |
| 5,376,580 A | 12/1994 | Kish et al. |
| 5,502,316 A | 3/1996 | Kish et al. |
| 5,544,185 A | 8/1996 | Kadoiwa et al. |

(Continued)

FOREIGN PATENT DOCUMENTS

| | | | |
|---|---|---|---|
| EP | 0695006 A1 * | 1/1996 | ....... H01L 21/02395 |
| JP | 61183986 A2 | 8/1986 | |

(Continued)

OTHER PUBLICATIONS

N. F. Gardner et al "1.4x Efficiency Improvement in Transparent-Substrate (AlxGa1-x)0.5In0.5P Light Emitting Diodes with Thin Active Regions" Applied Physics Letters, vol. 74, No. 15, Apr. 12, 1999, pp. 2230-2232.

D.A. Vanderwater et al , "High-Brightness AlGaInP Light Emitting Diodes", Proceedings of the IEEE, vol. 85, No. 11, Nov. 1997, pp. 1752-1764.

(Continued)

*Primary Examiner* — Robert Carpenter
(74) *Attorney, Agent, or Firm* — Volpe and Koenig, P.C.

(57) ABSTRACT

In some embodiments of the invention, a transparent substrate AlInGaP device includes an etch stop layer that may be less absorbing than a conventional etch stop layer. In some embodiments of the invention, a transparent substrate AlInGaP device includes a bonded interface that may be configured to give a lower forward voltage than a conventional bonded interface. Reducing the absorption and/or the forward voltage in a device may improve the efficiency of the device.

6 Claims, 2 Drawing Sheets

(56) References Cited

U.S. PATENT DOCUMENTS

| | | | |
|---|---|---|---|
| 5,656,829 | A | 8/1997 | Sakaguchi et al. |
| 5,793,062 | A | 8/1998 | Kish et al. |
| 5,917,202 | A | 6/1999 | Haitz et al. |
| 5,923,951 | A * | 7/1999 | Goossen ............ H01L 21/30612 257/E21.125 |
| 5,925,896 | A | 7/1999 | Dutta |
| 6,100,544 | A | 8/2000 | Lin et al. |
| 6,274,924 | B1 | 8/2001 | Carey et al. |
| 6,518,159 | B1 | 2/2003 | Tsunoda |
| 6,586,875 | B1 | 7/2003 | Chen et al. |
| 7,049,207 | B2 | 5/2006 | Tomoda |
| 7,087,941 | B2 | 8/2006 | Gardner et al. |
| 7,244,630 | B2 | 7/2007 | Krames et al. |
| 7,863,630 | B2 | 1/2011 | Takeuchi et al. |
| 7,960,745 | B2 | 6/2011 | Suzuki et al. |
| 8,044,439 | B2 | 10/2011 | Sakamoto et al. |
| 2003/0111667 | A1 | 6/2003 | Schubert |
| 2005/0093015 | A1 | 5/2005 | Kurahashi et al. |
| 2006/0021565 | A1 * | 2/2006 | Zahler .................... C30B 23/02 117/89 |
| 2006/0094138 | A1 | 5/2006 | Lai et al. |
| 2007/0045608 | A1 | 3/2007 | Wang et al. |
| 2007/0090399 | A1 | 4/2007 | Chin et al. |
| 2007/0194296 | A1 | 8/2007 | Murakami et al. |

FOREIGN PATENT DOCUMENTS

| | | |
|---|---|---|
| JP | 5055630 A2 | 3/1993 |
| JP | 8204277 A2 | 8/1996 |
| JP | 2000174379 A2 | 6/2000 |
| JP | 2002190619 A2 | 7/2002 |
| JP | 2005079152 A2 | 3/2005 |
| WO | 2007004745 A1 | 1/2007 |
| WO | 2007142071 A1 | 12/2007 |

OTHER PUBLICATIONS

Y.C. Lee et al, "High-Temperature Stability of 650-nm Resonant-Cavity Light-Emitting Diodes Fabricated Using Wafer-Bonding Technique on Silicon Substrates" IEEE Photonics Technology Letters, vol. 19, No. 14, Jul. 15, 2007 p. 1060-1062.
E.A. Fitzgerald et al, "Relaxed GexSil-x Structures for III-V Integration with Si and High Mobility Two-Dimensional Electron Gases in Si" J. Vac. Sci. Technol. B19(4), Jul. Aug 1992, American Vacuum Society, pp. 18070-1819.
CN Fifth Office Action for Application No. 200880120873.9, dated Jan. 15, 2014, 9 pgs.
CN First Office Action for Application No. 200880120873.9, dated Aug. 10, 2011, 15 pgs.
CN Fourth Office Action for Application No. 200880120873.9, dated Jul. 8, 2013, 7 pgs.
CN Second Office Action for Application No. 200880120873.9, dated May 21, 2012, 9 pgs.
CN Sixth Office Action for Application No. 200880120873.9, dated Aug. 4, 2014, 8 pgs.
CN Third Office Action for Application No. 200880120873.9, dated Dec. 12, 2012, 12 pgs.
EPO as ISA, International Search Report and Written Opinion for Application No. PCT/IB2008/055316 dated Aug. 28, 2009, 19 pages.
European Office Action for Application No. 08861415.1, dated Jan. 25, 2011, 6 pgs.
JP First Office Action for Application No. 2010-537596, dated Feb. 28, 2013, 7 pgs.
KR Office Action for Application No. 10-2010-7015533, dated Nov. 26, 2014, 8 pgs.
TW Office Action for Application No. 097148861, dated Dec. 16, 2013, 9 pgs.

* cited by examiner

LIGHT EMITTING DEVICE WITH BONDED INTERFACE

This application is a continuation of U.S. patent application Ser. No. 11/957,031, filed Dec. 14, 2007.

BACKGROUND

Field of Invention

The present invention relates to a semiconductor light emitting device with a doped wafer-bonded interface and/or a less absorbing etch stop layer.

Description of Related Art

Light emitting diodes (LEDs) are widely accepted as light sources in many applications that require low power consumption, small size, and high reliability. Energy-efficient diodes that emit light in the yellow-green to red regions of the visible spectrum contain active layers formed of an AlGaInP alloy. FIGS. 1A-1B and 2A-2B show the fabrication of a conventional transparent substrate (TS) AlGaInP LED. In FIGS. 1A-1B, an etch stop layer 12 such as a 1000 Å n-$In_{0.5}Ga_{0.5}P$ layer, is grown over a semiconductor substrate 10, typically GaAs. Device layers 14, including a lower confining layer, at least one $(Al_xGa_{1-x})_yIn_{1-y}P$ active layer, and an upper confining layer, all placed in a double heterostructure configuration, are grown over etch stop layer 12, followed by an optional thick (for example, between 5 and 100 µm thick) window layer 16, often p-type GaP grown by vapor phase epitaxy. The confining layers are made of a transparent semiconductor and enhance the internal quantum efficiency of the LED, defined as the fraction of electron-hole pairs in the active layer that recombine and emit light. The window layer 16, also a transparent semiconductor, increases the spread of electric current across the active layer and enhances the internal quantum efficiency of the diode. The light emitting region may consist of a single thick uniform composition layer or a series of thin wells and barriers.

GaAs is preferred as a growth substrate because it is lattice matched to $(Al_xGa_{1-x})_yIn_{1-y}P$ at compositions favored for the formation of LEDs that emit light in the yellow-green to red regions of the visible spectrum, at y~0.5. Since GaAs is absorbing, it is typically removed and replaced by a transparent substrate 18, as illustrated in FIGS. 2A-2B. GaAs substrate 10, shown in FIGS. 1A-1B, is removed by an etch that etches GaAs at a much faster rate than etch stop layer 12. A transparent substrate 18, typically n-type GaP, is wafer bonded to the lower surface of the epitaxial structure (etch stop layer 12 in FIGS. 2A-2B), generally by annealing the structure at an elevated temperature while uniaxial force is applied. LED chips are then processed from the bonded wafers using conventional metal contacts and chip fabrication techniques suitable for the p-type epitaxial GaP anode and the n-type wafer-bonded GaP cathode.

SUMMARY

In some embodiments of the invention, a transparent substrate AlInGaP device includes an etch stop layer that may be less absorbing than a conventional etch stop layer. In some embodiments of the invention, a transparent substrate AlInGaP device includes a bonded interface that may be configured to give a lower forward voltage than a conventional bonded interface. Reducing the absorption and/or the forward voltage in a device may improve the efficiency of the device.

In some embodiments, a light emitting device includes a first semiconductor structure comprising an AlGaInP light emitting layer disposed between an n-type region and a p-type region, and a second semiconductor structure. A bond formed at an interface disposed between the first and second semiconductor structures connects the first semiconductor structure to the second semiconductor structure. At least one semiconductor layer at the interface is doped to a concentration of at least $2 \times 10^{18}$ cm$^{-3}$. Increasing the dopant concentration at the bonded interface may reduce the forward voltage of the device.

In some embodiments, a light emitting device is formed by growing a first semiconductor structure on a GaAs substrate. The first semiconductor structure includes an etch stop layer with a thickness less than 150 Å and an AlGaInP light emitting layer disposed between an n-type region and p-type region. The GaAs substrate is removed, then the first semiconductor structure is bonded to a second semiconductor structure. The etch stop layer may be InGaP or AlGaInP, and may or may not be lattice-matched to GaAs. Reducing the thickness and/or changing the bandgap of the etch stop layer may reduce absorption by the etch stop layer.

DETAILED DESCRIPTION

It is desired to maximize the wall plug efficiency (WPE), defined as the ratio of light extracted from a device to electrical power supplied to the device, of AlGaInP LEDs. Embodiments of the invention attempt to improve the wall plug efficiency of an AlGaInP LED by improving the optical and/or electrical characteristics of the bonded interface between the epitaxial device structure and the transparent substrate.

Figure 2A:
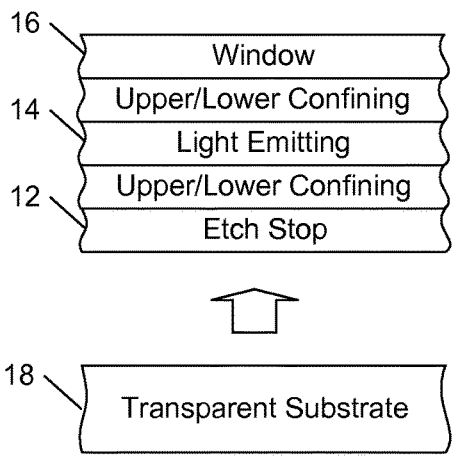
FIGS. 2A-2B illustrate a prior art transparent substrate AlGaInP LED.
Figure 2B:
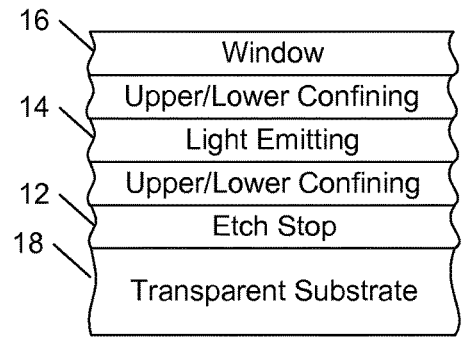

One method of increasing the light output of AlGaInP LEDs is to decrease the absorption of light within the device. One source of absorption is InGaP etch stop layer 12 of FIGS. 2A-2B. Since InGaP has a more narrow bandgap than the AlGaInP light emitting region, etch stop layer 12 will absorb some of the light emitted by the light emitting region.

Figure 3A:
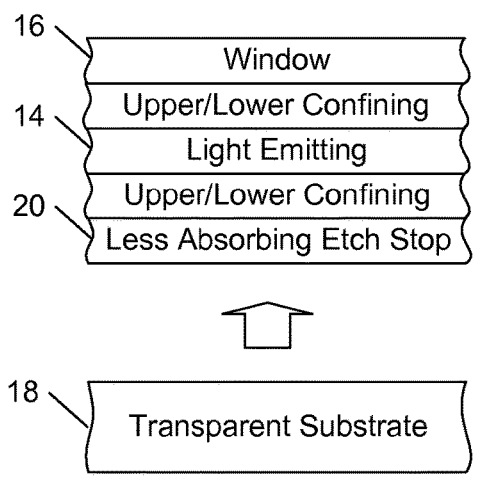
FIGS. 3A-3B illustrate a transparent substrate AlGaInP LED with an etch stop layer that is less absorbing than a conventional etch stop layer.
Figure 3B:
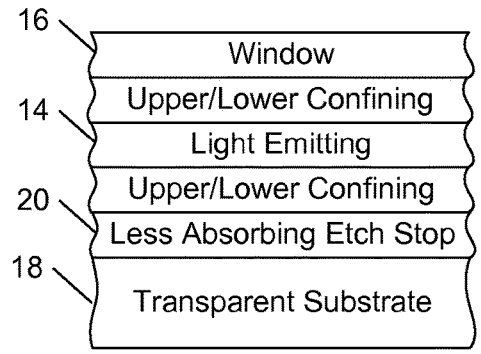

FIGS. 3A-3B illustrate a device with a less-absorbing etch stop layer 20. The fabrication of the device illustrated in FIGS. 3A-3B is similar to the device illustrated in FIGS. 2A-2B. Etch stop layer 20 is grown over an absorbing substrate, followed by device layers 14 and optional thick window layer 16. The absorbing substrate is removed, and the remaining structure is wafer-bonded to a transparent substrate 18. Contacts are formed on the wafer-bonded structure, then individual LEDs are diced.

In some embodiments, etch stop layer 20 is InGaP that is lattice matched to the GaAs growth substrate as in a conventional etch stop layer, but is formed thinner than a conventional InGaP etch stop layer and is thus less absorbing than a thick etch stop layer. For example, an InGaP etch stop layer 20 may have a thickness less than 250 Å, more preferably less than 150 Å, and more preferably less than 130 Å.

In some embodiments, etch stop layer 20 is a material that has a larger band gap, and is thus more transparent, than $In_{0.5}Ga_{0.5}P$. The band gap may be increased by increasing the amount of aluminum in the etch stop layer, or by decreasing the amount of indium in the etch stop layer. For example, etch stop layer 20 may be a quaternary AlGaInP or a ternary InGaP layer with a larger band gap than $In_{0.5}Ga_{0.5}P$. In an AlGaInP or InGaP etch stop layer 20, the InP composition may be less than 50%, preferably between 40 and 50%. The AlP composition in an AlGaInP layer may be between 0 and 50%, with the optimal AlP composition depending on LED configuration. For example, in a configuration where electrical current is passed through the etch stop layer, a lower AlP composition is preferred, for example in the range from 0% AlP to 10% AlP, where 10% AlP refers to the alloy $(Al_{0.20}Ga_{0.80})_{0.5}In_{0.5}P$. Alternatively, in a configuration where electrical current is not passed through the etch stop layer, a higher AlP composition is preferred, for example in the range from 10% AlP to 20% AlP, where 20% AlP refers to the alloy $(Al_{0.40}Ga_{0.60})_{0.5}In_{0.5}P$.

Larger band gap etch stop layer 20 may or may not be lattice-matched to the GaAs growth substrate. InGaP layers with an InP composition less than 50% are not lattice-matched to GaAs. Quaternary AlInGaP layers with a composition $(Al_xGa_{1-x})_{0.5}In_{0.5}P$, are lattice-matched to GaAs. Other quaternary alloys but with a higher band gap than lattice-matched InGaP, may be suitable as etch stop layer 20.

For example, a quaternary etch stop layer of $(Al_{0.10}Ga_{0.90})_{0.5}In_{0.5}P$ could be used for an LED configured to emit light in the red region of the visible spectrum with a dominant wavelength ≥620 nm. In such a case, the thickness of the quaternary etch stop layer is preferably ≤500 Å, more preferably ≤250 Å, and more preferably ≤150 Å. Alternatively, a non-zero AlP composition may be combined with a lower InP composition to make a more transparent layer, such as $(Al_{0.10}Ga_{0.90})_{0.55}In_{0.45}P$. For LEDs configured to emit shorter wavelength light, such as yellow or amber light, a higher AlP composition may be preferred, such as $(Al_{0.15}Ga_{0.85})_{0.5}In_{0.5}P$, or $(Al_{0.15}Ga_{0.85})_{0.55}In_{0.45}P$. Etch stop layers with AlP compositions as high as $(Al_{0.30}Ga_{0.70})_{0.5}In_{0.5}P$ have been shown to work, although in some examples of such LEDs with $(Al_{0.30}Ga_{0.70})_{0.5}In_{0.5}P$ etch stop layers, the LED $V_f$ has been observed to increase, possibly due to oxidation of the high AlP composition layers that are exposed to air, to the ambient in the high temperature wafer bonding process, or to the etch stop layer etching solution. One method of decreasing internal absorption while avoiding this high $V_f$ may be to slowly increase the AlP composition of the etch stop layer, either in a series of discrete steps, or in a continuous ramp. Alternatively, in the event that this etch stop layer is not used as an electrical contact layer, oxidation at this etch stop layer is not a problem, and even higher AlP compositions can be used, such as $(Al_{0.40}Ga_{0.60})_{0.5}In_{0.5}P$ or $(Al_{0.40}Ga_{0.60})_{0.55}In_{0.45}P$, with no $V_f$ penalty.

The emission spectrum of an LED is given approximately by FWHM≈1.8 kT, where FWHM is the full width at half maximum of the LED emission spectrum measured in eV, k is Boltzman's constant, and T is the LED temperature in Kelvin. To minimize internal absorption within the etch stop layer, the bandgap of the etch stop layer should thus be increased to a value of at least approximately 1.8 kT above the bandgap energy of the active layer. Since room temperature corresponds to roughly 25 meV, and since a biased LED will heat up above room temperature, in some embodiments the bandgap of the etch stop layer is increased to a value of at least 50 meV above the bandgap of the active layer, using increased AlP composition or decreased InP composition, or both.

Figure 1A:
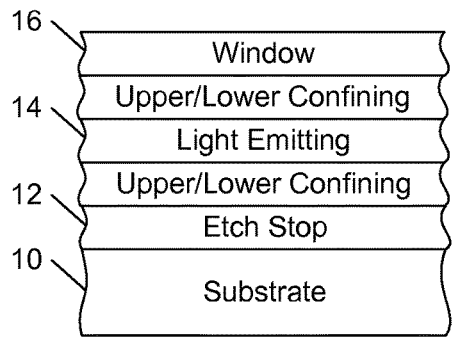
FIGS. 1A-1B illustrate a prior art AlGaInP LED device structure grown over an absorbing substrate.
Figure 1B:
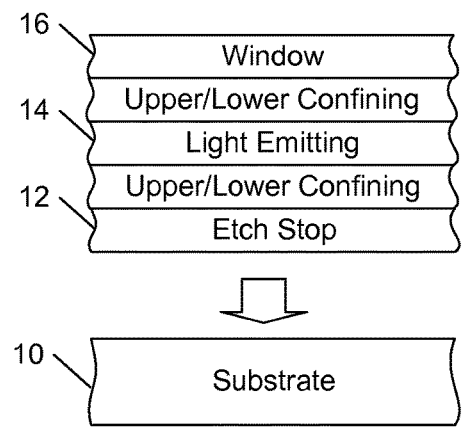

In devices where the light emitting layer emits long wavelength light, such as red and red-orange light, the AlP composition in the light emitting layer is low enough that etch stop layer 20 may be made transparent. For example, an LED configured to emit red light may have an active layer composition of $(Al_{0.05}Ga_{0.95})_{0.5}In_{0.5}P$. In such a case, the etch stop layer may be made transparent by using an etch stop layer with compositions such as $(Al_{0.15}Ga_{0.85})_{0.5}In_{0.5}P$ or $(Al_{0.10}Ga_{0.90})_{0.55}In_{0.45}P$. In such cases where the etch stop layer is transparent, the thickness of the etch stop layer is limited by strain and the Matthews-Blakeslee critical thickness, so thicker etch stop layers may be used, up to for example 500 Å thick. In some cases it may be impractical to increase the bandgap of the etch stop layer more than 50 meV above the active layer bandgap, so a compromise between the conventional etch stop layer 12 in FIGS. 1A-1B and the transparent etch stop layer described above may be preferred. For example, an etch stop layer with bandgap equal to or slightly greater than the active layer bandgap may be preferred in some case, while in other cases, an etch stop layer with bandgap=active layer bandgap+kT≈active layer bandgap+0.025 eV or an etch stop layer with bandgap=active layer bandgap+2 kT≈active layer bandgap+0.050 eV may be preferred.

A lattice-mismatched etch stop layer may be thin. In general, the larger the lattice mismatch, the thinner the layer should be in order to avoid strain relaxation. For example, an etch stop layer composed of $(Al_xGa_{1-x})_{0.60}In_{0.40}P$ grown on GaAs should be kept below a thickness of approximately 300 Å, while an etch stop layer composed of $(Al_xGa_{1-x})_{0.55}In_{0.45}P$ grown on GaAs should be kept below a thickness of approximately 800 Å to avoid strain relaxation. Thinner etch stop layers of these compositions may be preferred to avoid absorption if these compositions are not transparent to light emitted by the active layer. For example, a lattice-mismatched etch stop layer 20 may be less than 250 Å thick, more preferably less than 150 Å, and more preferably less than 130 Å.

The addition of AlP to a lattice-matched or lattice-mismatched etch stop layer may increase the temperature at which the etch stop layer is grown, which may favorably suppress the incorporation of oxygen impurities in the etch stop layer.

In some embodiments, multiple etch stop layers are included in the device. Multiple etch stop layers may be separated from each other by GaAs layers, though they need not be. At least one of these multiple etch stop layers may be composed of phosphide layers, such as InGaP or AlInGaP, while one or more other etch stop layers may be composed of arsenide layers such as AlGaAs. The device layers are grown over the last etch stop layer. Any of the etch stop layers described in the embodiments above may be used in a device with multiple etch stop layers. The etch stop layers in a device may each have the same properties (such as composition and thickness), though they need not. In a first example, a first InGaP etch stop layer is grown over a GaAs substrate, followed by a layer of GaAs, followed by a second InGaP etch stop layer. In a second example, an AlGaAs first etch stop layer is grown over a GaAs substrate, followed by an InGaP second etch stop layer. In a third example, an AlGaAs first etch stop layer is grown over a GaAs substrate, followed by an AlInGaP second etch stop layer.

Any of the above-described approaches, either individually, or in arbitrary combinations, may decrease internal absorption and therefore increase LED light output or WPE.

Another method of increasing the WPE of AlGaInP LEDs is to reduce the forward voltage $V_f$ of the device. One source of increased $V_f$ in a wafer-bonded transparent substrate AlGaInP LED is the wafer bonded interface between the transparent GaP substrate 18 and the AlGaInP device layers 14, which may contain incomplete "dangling" bonds, or impurities such as carbon, oxygen, or organic or inorganic compounds associated with the crystal growth, etching, and wafer bonding processes.

Figure 4A:
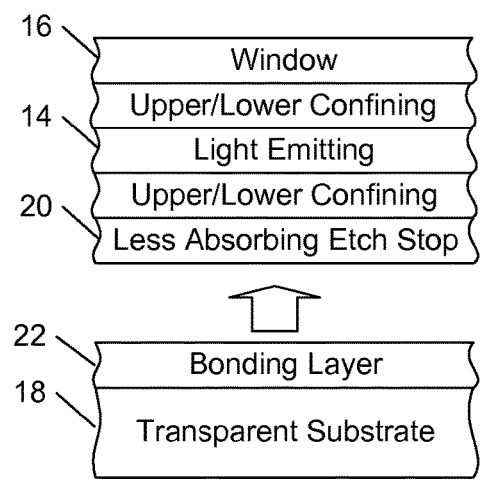
FIGS. 4A-4B illustrate a transparent substrate AlGaInP LED with an improved wafer bonded interface.
Figure 4B:
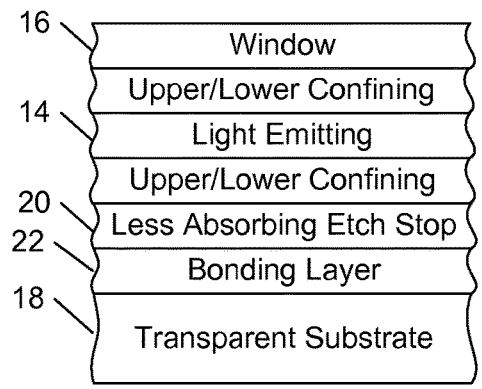

These dangling bonds or impurities typically create electronic defect states at or near the wafer-bonded interface that hinder carrier transport across the interface. One method of decreasing the effect of these defect states on $V_f$ is to dope the region at or near the wafer-bonded interface, as illustrated in FIGS. 4A-4B. In the device of FIGS. 4A-4B, device layers 14 are bonded to transparent substrate 18 by an interface between etch stop layer 20, grown with device layers 14, and an InGaP bonding layer 22, grown on transparent substrate 18. InGaP bonding layer 22 may have an InP composition between, for example, 0% and 50%, more preferably between 5% and 30%, and more preferably between 8% and 16%. In a conventional device, the layers forming the bonded interface are typically doped to a dopant concentration of approximately $1 \times 10^{18}$ cm$^{-3}$. In the device illustrated in FIGS. 4A-4B, the dopant concentration in one or both of bonding layer 22 and etch stop layer 20 is at least $2 \times 10^{18}$ cm$^{-3}$, more preferably at least $5 \times 10^{18}$ cm$^{-3}$, and more preferably at least $7 \times 10^{18}$ cm$^{-3}$, up to, for example, $2 \times 10^{19}$ cm$^{-3}$. In a preferred embodiment, the dopant is Te, though Si, S, or any other suitable dopant including p-type dopants may be used. The preferred doping levels may be higher when using a dopant such as Si, which is typically not fully activated. In addition, the optimum InP composition in bonding layer 22 may be higher, since the smaller Si atoms do not add additional strain to the lattice.

Device layers 14 include a light emitting region sandwiched between an n-type region and a p-type region. The light emitting region includes at least one light emitting layer, which is often undoped. In some embodiments, one or both of etch stop layer 20 and bonding layer 22 are more heavily doped than one or both of the n-type region and the p-type region.

On the top side of the bonded interface illustrated in FIGS. 4A-4B, etch stop layer 20 may be a conventional thick InGaP layer that is lattice-matched to GaAs, or an etch stop layer or layers according to embodiments of the invention, as described above. In the prior art device illustrated in FIGS. 1A-1B, an InGaP etch stop layer 12 is grown on a GaAs buffer layer which is grown on a GaAs substrate 10. The transition from GaAs to InGaP or to $(Al_xGa_{1-x})_yIn_{1-y}P$ requires the gas phase chemistry to be changed from AsH$_3$ in the GaAs layers to PH$_3$ in the InGaP or $(Al_xGa_{1-x})_yIn_{1-y}P$ layers, and a growth pause is typically used for this AsH$_3$ to PH$_3$ switching sequence. In some embodiments of the invention, the dopant source flow is left on during this growth pause in order to increase the dopant concentration in etch stop layer 20. The surface of the wafer is thus pre-purged with dopant as growth of the etch stop layer begins, which may increase the dopant concentration in etch stop layer 20. In some embodiments, the flow of PH$_3$ is reduced during growth of etch stop layer 20. In such cases, the PH$_3$ flow used during growth of etch stop layer 20 may be less than that used to grow device layers 14. For example, in some embodiments, the PH$_3$ flow used to grow etch stop layer 20 may be only 80% of the lowest PH$_3$ flow used to grow device layers 14. In other embodiments, the PH$_3$ flow used to grow layer 20 may be only 50% of the lowest PH$_3$ flow used to grow device layers 14.

On the bottom side of the bonded interface illustrated in FIGS. 4A-4B is bonding layer 22. Transparent substrate 18 is composed of GaP and bonding layer 22 is composed of $In_xGa_{1-x}P$, where x is typically between 0% and 50%, more preferably between 5% and 30%, and more preferably between 8% and 16%. Since x is typically not 0%, bonding layer 22 is not lattice matched to the GaP substrate 18, and InGaP bonding layer 22 is grown to a thickness that typically is in the range from 0.5× to 3× the Matthews-Blakeslee critical thickness for strain relaxation. If relaxed, the InGaP bonding layer 22 typically has a mild cross hatch on the wafer surface, with a peak to valley surface roughness ~5 to 15 nm, and an RMS roughness ~2 to 3 nm in a 10×10 or 50×50 µm atomic force microscope image.

High doping in the bonding layer is conventionally achieved by increasing the dopant source flow. In the case of large dopant atoms such as Te, there is a significant competition between the incorporation of large dopant atoms such as Te and the incorporation of large matrix element atoms such as indium into the smaller GaP crystal lattice. This competition creates a feedback loop between Te suppression and indium suppression in InGaP bonding layer 22. Maintaining the desired InP composition while simultaneously increasing the Te doping concentration requires the use of higher Te doping source flow, but the higher Te doping source flow suppresses indium incorporation and reduces InP composition, which requires the use of higher indium source flow. This higher indium source flow in turn suppresses Te incorporation and requires even higher Te doping source flow, which in turn requires even higher indium source flow. This competition often results in either too little InP in bonding layer 22, or too much InP in bonding layer 22, thus making it difficult to reproducibly grow a bonding layer of the desired thickness, InP composition, and dopant concentration. Too much InP can lead to the onset of a three dimensional island growth mode which gives a surface that is too rough, and often results in films that are highly defective and non-conducting, producing an LED with high $V_f$. Too little InP can result in a poor quality bond, and bubbles at the bonded interface. Since InP has a weaker bond strength than GaP, the presence of InP at the wafer bonded interface allows for more atomic re-arrangement at the wafer bonded interface during wafer bonding, and thus improves the bond between transparent substrate 18 and etch stop layer 20. A minimum amount of InP is therefore preferred at the bonded interface.

In some embodiments of the invention, InGaP bonding layer 22 is grown to a thickness where bonding layer 22 relaxes enough to permit more incorporation of dopant. For example, bonding layer 22 may be grown to a thickness greater than 3000 Å thick, more preferably between 5,000 and 20,000 Å, and more preferably between 5,000 and 10,000 Å, which may exceed the Matthews-Blakeslee critical thickness by as much as 3× or more. As the thickness of bonding layer 22 increases, the surface roughness typically increases, for example to a peak to valley surface roughness ~15 nm to ~50 nm or more, and RMS roughness of 3 nm to 6 nm or more. The rough surface and reduced strain may decrease the competition between In and Te incorporation in the bonding layer, and may substantially decouple the interaction between In and Te incorporation into the bonding layer, permitting the incorporation of more Te for a given Te doping source flow. This decoupling of the Te and In incorporation may result in a more reproducible manufacturing process. In some embodiments, bonding layer 22 is grown thick enough to begin to substantially relax, and a constant doping source flow is used during growth of InGaP bonding layer 22, resulting in a dopant concentration that naturally increases for a fixed doping source flow rate. In other embodiments, a fixed dopant source flow is used until the InGaP bonding layer 22 substantially relaxes, then a higher dopant source flow is used to further increase the dopant concentration in the film without substantially decreasing the indium composition in the film, or without increasing the indium source flow. In such an embodiment, the doping concentration in the film can be increased to greater than $1 \times 10^{19}$ cm$^{-3}$, while maintaining the InP composition in bonding layer 22 to within 0.5% of the target value, with no change in indium source flow. In some embodiments, at least a part of the InGaP bonding layer is doped to a concentration of at least $5 \times 10^{18}$ cm$^{-3}$.

The increased surface roughness of bonding layer 22 may also increase the wafer bonding yield by decreasing bubbles at the wafer-bonded interface, in contrast to Hoshi, who teaches in U.S. Pat. No. 5,196,375 that smoother surfaces with peak to valley roughness <13 nm are preferred for low bubble density in wafer-bonded layers.

In a first example of a TS AlGaInP device according to embodiments of the invention, the etch stop layer is conventional, for example, InGaP lattice-matched to GaAs grown to a thickness greater than 250 Å. Bonding layer 22 is InGaP with an InP composition between 0% and 50%, more preferably between 5% and 30%, and more preferably between 8% and 16%, grown to a thickness greater than 700 Å, and doped with Te to a concentration of $8 \times 10^{18}$ cm$^{-3}$. The $V_f$ of such a device has been observed to be less than the $V_f$ of a conventional device.

In a second example of a TS AlGaInP device according to embodiments of the invention, the etch stop layer is conventional, for example, InGaP lattice-matched to GaAs grown to a thickness greater than 250 Å. Bonding layer 22 is InGaP with an InP composition between 0% and 50%, more preferably between 5% and 30%, and more preferably between 8% and 16%, grown to a thickness between 2,000 and 20,000 Å, and doped with Te to a concentration of $8 \times 10^{18}$ cm$^{-3}$. The $V_f$ of such a device has been observed to be less than the $V_f$ of a conventional device.

In a third example, etch stop layer 20 is InGaP lattice-matched to GaAs, grown to a thickness less than 150 Å and doped with Te to a concentration less than $10^{18}$ cm$^{-3}$, according to embodiments of the invention. Bonding layer 22 is InGaP with an InP composition between 0% and 50%, more preferably between 5% and 30%, and more preferably between 8% and 16%, grown to a thickness between 2,000 and 20,000 Å, and doped with Te to a concentration of $8 \times 10^{18}$ cm$^{-3}$. The $V_f$ of such a device has been observed to be about the same as the $V_f$ of a conventional device, though the device has higher light output than a conventional device.

In a fourth example, etch stop layer 20 is AlGaInP lattice-mismatched to GaAs, grown thin enough to avoid strain relaxation, with, for example, a composition of $(Al_{0.10}Ga_{0.90})_{0.55}In_{0.45}P$ and a thickness less than 500 Å, doped with Te to a concentration greater than $2 \times 10^{18}$ cm$^{-3}$. Bonding layer 22 is InGaP with an InP composition between 0% and 50%, more preferably between 5% and 30%, and more preferably between 8% and 16%, grown to a thickness between 2,000 and 20,000 Å, and doped with Te to a concentration of $8 \times 10^{18}$ cm$^{-3}$.

In a fifth example, the active layer is $In_{1-y}Ga_yP$ with $0.45 \leq y \leq 0.55$, and etch stop layer 20 is AlGaInP lattice-mismatched to GaAs, grown thin enough to avoid strain relaxation, with, for example, a composition of $(Al_{0.10}Ga_{0.90})_{0.55}In_{0.45}P$ and a thickness less than 500 Å, doped with Te to a concentration greater than $5 \times 10^{17}$ cm$^{-3}$. Bonding layer 22 is InGaP with an InP composition between 8% and 16%, grown to a thickness between 800 and 20,000 Å, and doped with Te to a concentration greater than $1 \times 10^{18}$ cm$^{-3}$.

Having described the invention in detail, those skilled in the art will appreciate that, given the present disclosure, modifications may be made to the invention without departing from the spirit of the inventive concept described herein. For example, though the embodiments described herein are III-P light emitting diodes, it is to be understood that other devices, such as lasers, and other materials systems are within the scope of the invention. Therefore, it is not intended that the scope of the invention be limited to the specific embodiments illustrated and described.

What is being claimed is:

1. A device comprising:
   a first semiconductor structure that includes:
   an AlGaInP etch stop layer, having a thickness of less than 800 Å, that forms a first semiconductor surface of the first semiconductor structure;
   an AlGaInP light emitting layer disposed between an n-type region and a p-type region, a bandgap of the AlGaInP etch stop layer being at least as large as a bandgap of the AlGaInP light emitting layer; and
   a window layer through which light emitted by the light emitting layer is emitted from the device, the light emitting layer being disposed between the etch stop layer and the window layer; and
   a second semiconductor structure that includes a second semiconductor surface that is directly bonded to the first semiconductor surface.

2. The device of claim 1, wherein the etch stop layer comprises $(Al_xGa_{1-x})_yIn_{1-y}P$; where x is not greater than 0.3, and y is at least 0.5.

3. The device of claim 1, wherein the etch stop layer comprises $(Al_xGa_{1-x})_yIn_{1-y}P$; where x is not greater than 0.4, and y is at least 0.55.

4. The device of claim 1, wherein a thickness of the etch stop layer is less than 250 Å.

5. The device of claim 1, wherein the second semiconductor structure comprises a transparent GaP layer at least 10 µm thick.

6. The device of claim 1, wherein the etch stop layer is formed from a material that stops an etchant that etches GaAs.

* * * * *